United States Patent
Miller et al.

(10) Patent No.: US 6,765,973 B1
(45) Date of Patent: Jul. 20, 2004

(54) LOW POWER APPARATUS AND ALGORITHM FOR SUB-RATE BIT ACQUISITION AND SYNCHRONIZATION OF HIGH SPEED CLOCKLESS DATA STREAMS

(75) Inventors: Karl Eric Miller, Chandler, AZ (US); Loran Albert Wilcox, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/501,801

(22) Filed: Feb. 9, 2000

(51) Int. Cl.$^7$ ................................................. H04L 7/00
(52) U.S. Cl. ........................................................ 375/354
(58) Field of Search ............................... 375/354, 355, 375/359, 367, 371, 372, 373; 708/422, 425, 426

(56) References Cited

U.S. PATENT DOCUMENTS

| | | | | |
|---|---|---|---|---|
| 4,813,006 A | * | 3/1989 | Burns et al. ................... 708/5 |
| 4,969,163 A | * | 11/1990 | Ungerboeck ................ 375/234 |
| 5,291,209 A | * | 3/1994 | Evans et al. ................ 342/381 |
| 5,550,860 A | * | 8/1996 | Georgiou et al. ............ 375/220 |
| 5,630,100 A | * | 5/1997 | Ganapathy et al. ........... 703/14 |
| 5,699,389 A | * | 12/1997 | Beladi et al. ................ 375/371 |
| 5,774,462 A | * | 6/1998 | Ishikawa et al. ............ 370/350 |
| 6,044,122 A | * | 3/2000 | Ellersick et al. ............ 375/360 |
| 6,064,695 A | * | 5/2000 | Raphaeli ..................... 375/230 |
| 6,075,807 A | * | 6/2000 | Warren et al. .............. 375/143 |
| 6,177,904 B1 | * | 1/2001 | Coenen et al. ................ 342/62 |
| 6,178,212 B1 | * | 1/2001 | Akashi ........................ 375/355 |
| 6,208,685 B1 | * | 3/2001 | Yamazaki ................... 375/152 |
| 6,275,545 B1 | * | 8/2001 | Suzuki ........................ 375/343 |
| 6,285,723 B1 | * | 9/2001 | Yamada et al. .............. 375/354 |
| 6,496,474 B1 | * | 12/2002 | Nagatani et al. ............ 370/208 |

* cited by examiner

Primary Examiner—Emmanuel Bayard
(74) Attorney, Agent, or Firm—James E. Klekotka; Frank J. Bogacz

(57) ABSTRACT

A clockless synchronizer (200) is used for sub-rate bit acquisition and synchronization of high speed clockless data streams. Clockless synchronizer (200) comprises burst detector (210), multi-phase signal generator (220), multi-phase signal router (230), multi-phase signal sampler (240), clock generator (250), correlation control circuit (260), and output data selector (270). Clockless synchronizer (200) is fabricated on a single ASIC, and it is free from the 'data rate less than the available clock' limitation.

13 Claims, 6 Drawing Sheets

| OUTPUT SIGNALS | | | | | | | | | INPUT SIGNALS | | | | | | | | EDGE | | DECISION |
|---|---|---|---|---|---|---|---|---|---|---|---|---|---|---|---|---|---|---|---|
| O1 | O2 | O3 | O4 | O5 | O6 | O7 | O8 | O9 | I1 | I2 | I3 | I4 | I5 | I6 | I7 | I8 | E1 | E2 | PICK |
| 0 | 0 | 0 | 0 | 1 | 1 | 1 | 1 | 0 | 0 | 0 | 0 | 1 | 0 | 0 | 0 | 1 | 4 | 8 | 6 |
| 1 | 0 | 0 | 0 | 0 | 1 | 1 | 1 | 1 | 1 | 0 | 0 | 0 | 1 | 0 | 0 | 0 | 1 | 5 | 3 OR 7 |
| 1 | 1 | 0 | 0 | 0 | 0 | 1 | 1 | 1 | 0 | 1 | 0 | 0 | 0 | 1 | 0 | 0 | 2 | 6 | 4 |
| 1 | 1 | 1 | 0 | 0 | 0 | 0 | 1 | 1 | 0 | 0 | 1 | 0 | 0 | 0 | 1 | 0 | 3 | 7 | 5 |
| 1 | 1 | 1 | 1 | 0 | 0 | 0 | 0 | 1 | 0 | 0 | 0 | 1 | 0 | 0 | 0 | 1 | 4 | 8 | 6 |
| 0 | 1 | 1 | 1 | 1 | 0 | 0 | 0 | 0 | 1 | 0 | 0 | 0 | 1 | 0 | 0 | 0 | 1 | 5 | 3 OR 7 |
| 0 | 0 | 1 | 1 | 1 | 1 | 0 | 0 | 0 | 0 | 1 | 0 | 0 | 0 | 1 | 0 | 0 | 2 | 6 | 4 |
| 0 | 0 | 0 | 1 | 1 | 1 | 1 | 0 | 0 | 0 | 0 | 1 | 0 | 0 | 0 | 1 | 0 | 3 | 7 | 5 |
| 0 | 0 | 0 | 0 | 1 | 1 | 1 | 1 | 0 | 0 | 0 | 0 | 1 | 0 | 0 | 0 | 1 | 4 | 8 | 6 |

FIG. 7

| CLK | OUTPUT SIGNALS | | | | | | | | | INPUT SIGNALS | | | | | | | | EDGE |
|---|---|---|---|---|---|---|---|---|---|---|---|---|---|---|---|---|---|---|
| | $O_a$ | $O_b$ | $O_c$ | $O_d$ | $O_e$ | $O_f$ | $O_g$ | $O_h$ | $O_i$ | $I_a$ | $I_b$ | $I_c$ | $I_d$ | $I_e$ | $I_f$ | $I_g$ | $I_h$ | |
| 1 | 0 | 0 | 0 | 1 | 0 | 1 | 1 | 1 | 1 | 0 | 0 | 1 | 1 | 1 | 0 | 0 | 0 | d |
| 2 | 0 | 0 | 0 | 0 | 1 | 1 | 1 | 1 | 1 | 0 | 0 | 0 | 1 | 0 | 0 | 0 | 0 | d |
| 3 | 0 | 0 | 0 | 0 | 1 | 0 | 1 | 1 | 1 | 0 | 0 | 0 | 1 | 1 | 1 | 0 | 0 | e |
| 4 | 0 | 0 | 0 | 0 | 0 | 1 | 1 | 1 | 1 | 0 | 0 | 0 | 0 | 1 | 0 | 0 | 0 | e |
| 5 | 0 | 0 | 0 | 0 | 0 | 1 | 0 | 1 | 1 | 0 | 0 | 0 | 0 | 1 | 1 | 1 | 0 | e |
| 6 | 0 | 0 | 0 | 0 | 0 | 0 | 1 | 1 | 1 | 0 | 0 | 0 | 0 | 0 | 1 | 0 | 0 | e |
| 7 | 1 | 1 | 1 | 0 | 1 | 0 | 0 | 0 | 0 | 0 | 0 | 1 | 1 | 1 | 0 | 0 | 0 | d |
| 8 | 1 | 1 | 1 | 1 | 0 | 0 | 0 | 0 | 0 | 0 | 0 | 0 | 1 | 0 | 0 | 0 | 0 | d |
| 9 | 1 | 1 | 1 | 1 | 0 | 1 | 0 | 0 | 0 | 0 | 0 | 0 | 1 | 1 | 1 | 0 | 0 | e |
| 10 | 1 | 1 | 1 | 1 | 1 | 0 | 0 | 0 | 0 | 0 | 0 | 0 | 0 | 1 | 0 | 0 | 0 | e |
| 11 | 1 | 1 | 1 | 1 | 1 | 0 | 1 | 0 | 0 | 0 | 0 | 0 | 0 | 1 | 1 | 1 | 0 | e |
| 12 | 1 | 1 | 1 | 1 | 1 | 1 | 0 | 0 | 0 | 0 | 0 | 0 | 0 | 0 | 1 | 0 | 0 | e |

*FIG. 8*

LOW POWER APPARATUS AND ALGORITHM FOR SUB-RATE BIT ACQUISITION AND SYNCHRONIZATION OF HIGH SPEED CLOCKLESS DATA STREAMS

FIELD OF THE INVENTION

The present invention relates generally to the transfer of data and, more particularly, to a method and apparatus for transferring data using a clockless interface.

BACKGROUND OF THE INVENTION

Large data systems require the transmission of large quantities of data at high rates throughout the system. The interfaces supporting these high data rates are typically limited by a data rate that must be lower than the available clock rate unless a power consuming phase lock loop (PLL) interface is employed. Furthermore, clock distribution and clock phase maintenance is a difficult and power consuming task for such a system. A higher performance/lower power solution is highly desirable.

The PLL recovery method requires a phase lock loop in each recovery circuit, and the phase lock loops add to the power requirements of the system. The embedded clock method requires the transmission of the associated clock with the transmitted data and requires controlled skew between the transmitted data and the clock for the entire transmission path. Other methods include oversampling clock recovery techniques. The oversampling clock recovery method requires the availability of clocks that are at a higher frequency than the data they are intended to recover. The oversampling method also requires more power due to the higher speed clocks.

What is needed is a method and apparatus for transferring data that is low power, high-speed, and can operate on self-contained mobile platforms.

Further needed is a method and apparatus for using a clockless interface for transferring data and for synchronizing of the clockless data.

BRIEF DESCRIPTION OF THE DRAWINGS

A more complete understanding of the invention can be derived by referring to the detailed description and claims when considered in connection with the figures, wherein like reference numbers refer to similar items throughout the figures, and:

FIG. 7 illustrates an exemplary decision table used in accordance with the decision circuit shown in FIG. 6; and FIG. 8 illustrates a second exemplary decision table used in accordance with the decision circuit shown in FIG. 6.

DETAILED DESCRIPTION OF A PREFERRED EMBODIMENT

The invention provides a method and apparatus for transferring data that is low power, high-speed, and can operate on self-contained mobile platforms.

Furthermore, the invention provides a method and apparatus for using a clockless interface for transferring data and for synchronizing of the clockless data.

In a preferred embodiment, a plurality of multiphase versions of the data signal are generated for the clockless interface. An efficient binary comparison is performed in the 'phase domain' using the plurality of multiphase versions of the data signal. The clockless interface provides a solution that is free from the 'data rate less than the available clock' limitation. A clock is recovered at each clockless interface via a digital gate delay based on a tap delay multi-phase signal generation scheme.

Figure 1:
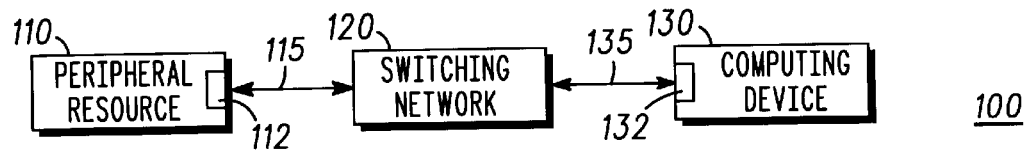
FIG. 1 shows a simplified block diagram of a communications network in accordance with a preferred embodiment of the invention.

FIG. 1 shows a simplified block diagram of a communications network in accordance with a preferred embodiment of the invention. Communications network 100 comprises at least one peripheral resource 110, a switching network 120, and at least one computing device 130. In a preferred embodiment, a plurality of compatible interface devices and a plurality of compatible switching devices are used to interconnect a number of computers and a number of peripheral resources. The compatible interface devices and the protocols associated with them allow software to control and monitor the computers and the peripheral resources.

A peripheral resource has at least one control/status interface device 112 that allows the peripheral to be loosely coupled to at least one compatible switching device. A computer has at least one control/status interface device 132 that allows the computer to be loosely coupled to at least one compatible switching device.

Communications network 100 uses interface devices 112 and 132 to provide virtual point to point connections for packet transfers between any two components. Interface devices can use single and/or multiple-stage transport cycles. Interface devices can use acknowledgement (ACK), non-acknowledgement (NACK) protocols, or ACK/NACK protocols. Interface devices comprise both software and hardware and can be programmed using software routines.

In a preferred embodiment, link 115 couples switching network 120 and peripheral resource 110 using at least one interface device 112. In addition, link 135 couples switching network 120 and computing device 130 using at least one interface device 132.

Switching network 120 provides a plurality of buffer-less, cut-through, full-duplex network switches capable of point to point and point to multipoint transfers. Switching network 120 maintains the master synchronization timing for network 100. In a preferred embodiment, compatible switching units place timing synchronization information into a field in the header of packets that pass through them. Switches in the switching network and interface devices use valid synchronization timing to stay in sync. The embedded synchronization timing is the number of clock cycles since the start of the transport period that the first bit of the packet left the component.

In a preferred embodiment, links 115 and 135 comprise a series of (LVDS) differential point-to-point connections that consist of a transmit pair and a receive pair of interconnects operating in a full duplex mode. Desirably, links 115 and 135 allow transfer rates as high as 100 MBPS.

Additional power savings are achieved on links 115 and 135 by using a clockless data transfer between the compatible components with a minimal preamble for fast acquisition of data. Clockless data transfer uses the transmit and receive data pairs without an embedded clock or clock lines. Desirably, clockless data transfer between components saves power by reducing the number of lines required and the number of transitions that occur on the lines. In addition, using a minimal preamble, 8–16 bits, for data acquisition decreases active time and saves power.

In addition, communications network 100 incorporates a hardware based power management mechanism that automatically removes the internal clock from unused circuits when they are idle. Desirably, removing the internal clock results in reducing the amount of power used by the network components.

Figure 2:
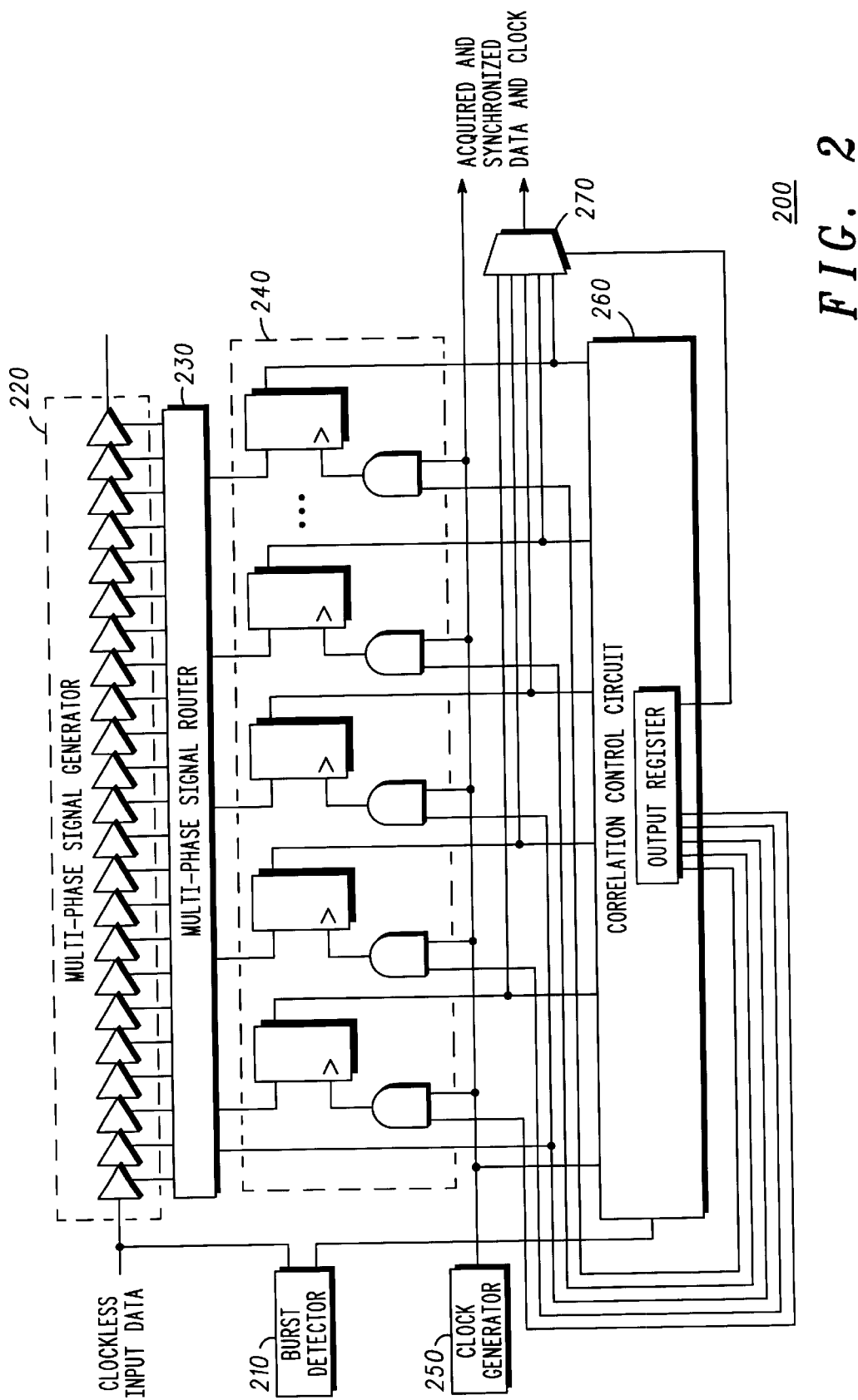
FIG. 2 illustrates a simplified block diagram for a clockless synchronizer in-accordance with a preferred embodiment of the invention.

FIG. 2 illustrates a simplified block diagram for a clockless synchronizer in accordance with a preferred embodiment of the invention. In a preferred embodiment, an interface device comprises at least one clockless synchronizer. In addition, the compatible switching devices in the switching network comprise at least one clockless synchronizer.

Clockless synchronizer 200 comprises burst detector 210, multi-phase signal generator 220, multi-phase signal router 230, multi-phase signal sampler 240, clock generator 250, correlation control circuit 260, and output data selector 270.

In a preferred embodiment, clockless synchronizer 200 is fabricated on a single Application Specific Integrated Circuit (ASIC), although this is not required for the invention. In alternate embodiments, two or more ASICs could be used. For example, optimizing analog and digital performance parameters, such as speed and power dissipation, can be more easily managed using multiple ASICs.

In a preferred embodiment, clockless synchronizer 200 is fabricated using high-speed Complementary Metal Oxide Semiconductor (CMOS) devices, although this is not required for the invention. In this case, high speed CMOS is used to obtain the packing density required for this complexity. Alternate embodiments, could use other materials such as GaAs.

In an alternate embodiment, a field programmable gate array (FPGA) can be used. In another embodiment, a digital signal processor (DSP) could be used.

Burst detector 210 starts during the power-up sequence and runs continuously waiting for a burst to occur. In a preferred embodiment, burst detector 210 is implemented using a state machine. In alternate embodiments, a hardware detector could be used. In other embodiments, burst detector 210 can comprise both hardware and software elements.

In a preferred embodiment, burst detector 210 is coupled to correlation control circuit 260. In alternate embodiments, burst detector 210 can be coupled to other elements in clockless synchronizer 200.

In a preferred embodiment, burst detector 210 triggers on the first non-zero bit in a training bit sequence. In alternate embodiments, a training bit sequence is not required. In a preferred embodiment, the training bit sequence comprises a number of synchronization bits that allow the clock selection to occur before the first data bit. For example, eight to sixteen bits have been used in various embodiments. A training bit sequence is used for every data stream.

Multi-phase signal generator 220 is coupled to multi-phase signal router 230 via a plurality of interconnections. Multi-phase signal generator 220 provides a plurality of signals to multi-phase signal router 230, and each of these signals is phase-shifted relative to the others. In a preferred embodiment, the phase shift is provided using the inherent gate delay in a digital ASIC. A series of gates are used, and an output tap is provided after every gate. In alternate embodiments, taps are not provided after every gate. For example, taps can be provided separated by different numbers of gates.

In a preferred embodiment, a gate comprises at least one semiconductor junction. In alternate embodiments, delays can be provided using passive elements.

Multi-phase signal router 230 is coupled to multi-phase signal sampler 240 using a number of different paths. In a preferred embodiment, multi-phase signal sampler 240 comprises a number of sampling circuits and multi-phase signal router provides one an enable/disable signal for each sampling circuit. Clock generator 250 is coupled to multi-phase signal sampler 240 using a number of different paths. The paths are equal in length with respect to the timing.

Multi-phase signal router 230 is designed and fabricated using a set of constraint equations to determine how many taps are needed and which signals need to be routed. In a preferred embodiment, a hardware implementation is used. In alternate embodiments, switches can be used, and the multi-phase signal router can be dynamically reconfigured.

Clock generator 250 is coupled to correlation control circuit 260 using a single path.

Multi-phase signal sampler 240 is coupled to correlation control circuit 260 using a number of different paths. The paths are equal in length with respect to the timing.

In a preferred embodiment, multi-phase signal sampler 240 comprises a number of sampling circuits and correlation control circuit 260 provides one enable/disable signal for each sampling circuit. In addition, output signals from the sampling circuits in multi-phase signal sampler 240 are sent to correlation control circuit 260.

In a preferred embodiment, correlation control circuit 260 performs a binary comparison of the multi-phase signals and performs a correlation with a local clock signal as specified by the set of constraint equations being used. For example, a binary comparison can be done using edge detection.

Output data selector 270 is coupled to multi-phase signal sampler 240 using a number of different paths. In a preferred embodiment, output signals from the sampling circuits in multi-phase signal sampler 240 are sent to output data selector 270. In addition, a data selector signal is sent from correlation control circuit 260 to output data selector 270. As a result of the correlation calculations, correlation control circuit 260 selects the best multiphase signal to provide at the output and provides the data selector signal to the cause this to happen.

In a preferred embodiment, correlation control circuit 260 is implemented using a state machine. In addition, the state machine provides "power down" signals to other unused sampling circuits for the remainder of the data burst.

Figure 3:
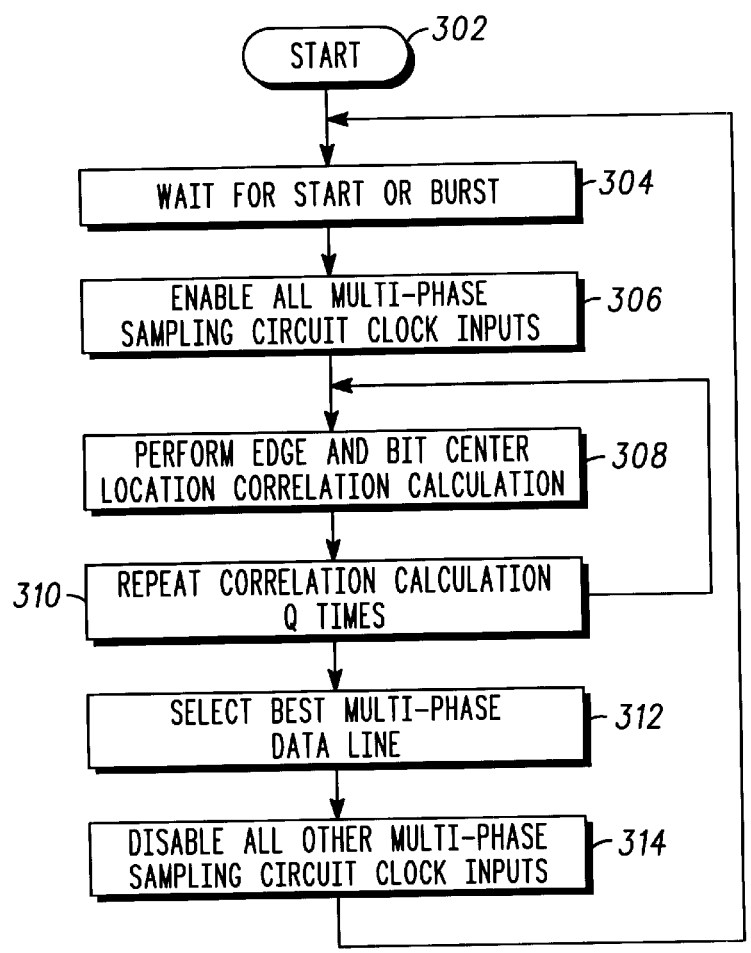
FIG. 3 illustrates a flow diagram of a method for providing a synchronized output signal clockless synchronizer in accordance with a preferred embodiment of the invention.

FIG. 3 illustrates a flow diagram of a method for providing a synchronized output signal clockless synchronizer in accordance with a preferred embodiment of the invention. Procedure 300 starts in step 302. In a preferred embodiment, the network sends a start signal (i.e., power-on reset) during a power-up sequence.

In step 304, a burst detector circuit starts during the power-up sequence and runs continuously waiting for a burst to occur. The burst detector triggers on the first non-zero bit in the training bit sequence.

In step 306, the inputs to the multi-phase sampling circuits are enabled. In a preferred embodiment, an output from the burst detector is used by the correlation control state machine to enable power-up to occur in the multiphase signal sampler circuit.

In a preferred embodiment, the sampling function is performed using multiple flip-flop circuits.

In step 308, the correlation control circuit performs edge and bit center location "correlation" calculations. In a preferred embodiment, a state machine performs a binary comparison on adjacent multi-phase signals to determine a Signal High Time Range. The Signal High Time Range is correlated with a local clock signal to determine which multi-phase signal is best correlated with the desired setup and hold times. In a preferred embodiment, the setup and hold times are substantially balanced, and the correlation is performed in simple combinational logic that selects the tap that is equidistant from the edge detects. In alternate embodiments, the setup and hold times do not have to be balanced.

In step 310, the correlation calculation is performed "Q" times, where "Q" is an integer number that is equal to or less than the number of training bit pairs, where a bit pair is defined as a "zero" followed by a "one". Edge detect and correlation can be performed for multiple leading training bit pairs to average out the jitter and to increase the probability of acquisition.

The probability of acquisition for N training bit pairs is:

$$-PN=1-(1-P1)^N$$

where P1 is the probability of acquiring one training bit pair.

In step 312, the best multi-phase signal is selected. Desirably, the best correlated multi-phase signal is determined to be the one in which the rising edge of the local clock correlates closest to the middle of the valid data period of the signal for a balanced timing case.

In step 314, the inputs to the multi-phase sampling circuits are disabled. In a preferred embodiment, the correlation control circuit drives the sampling flip-flops in the multi-phase signal sampling circuit. Desirably, by disabling the inputs to the flip-flops, the flip-flops are disabled and consume less power. By turning the flip-flops on only during the 'acquisition phase', the power consumption is lessened.

Procedure 300 branches back to step 304 and iterates as shown in FIG. 3.

Figure 4:
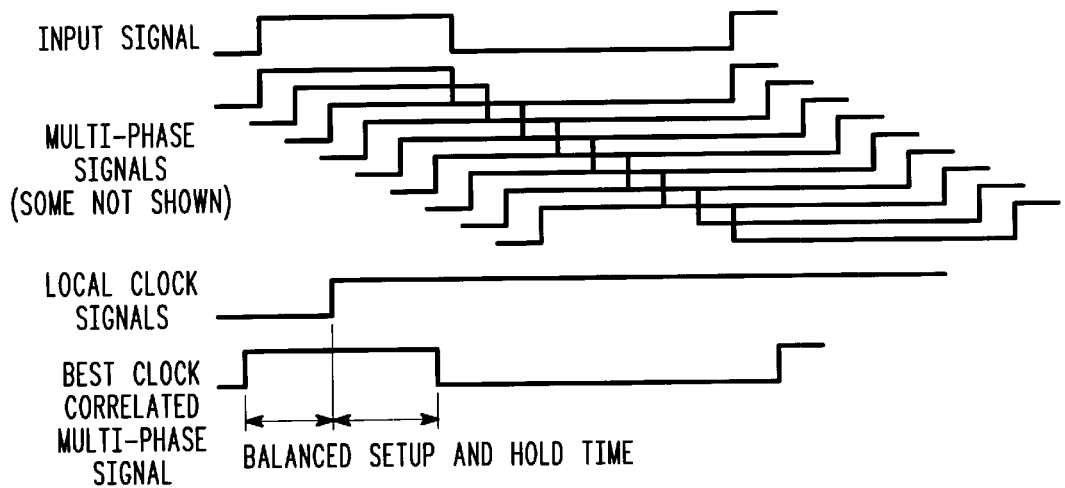
FIG. 4 illustrates a simplified timing diagram for the correlation calculation in accordance with a preferred embodiment of the invention.

FIG. 4 illustrates a simplified timing diagram for the correlation calculation in accordance with a preferred embodiment of the invention. In FIG. 4, an input signal is shown having a single "1" bit. An alternating "1", "0" pattern is provided in the preamble to provide the correlation calculation to occur with the maximum opportunities for edge/correlation processing.

A number of multi-phase signals are also shown in FIG. 4. As illustrated in FIG. 4, the delay between adjacent multiphase signals is substantially the same.

In addition, a local clock signal is shown having a rising edge that is used in the correlation calculation.

Finally, the best correlated multi-phase signal is shown along with the balanced setup and hold times. The balanced setup and hold times are shown relative to the rising edge of the local clock signal. Desirably, balanced setup and hold times allow for an easier alignment, when the valid data period for both the high and the low data bits are the same. For example, if the setup and hold times are not balanced, increased jitter can occur.

Figure 5:
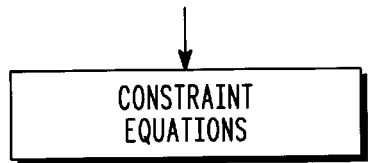
FIG. 5 illustrates a simplified flow diagram for the constraint equation calculation procedure in accordance with a preferred embodiment of the invention.

FIG. 5 illustrates a simplified flow diagram for the constraint equation calculation procedure in accordance with a preferred embodiment of the invention. In a preferred embodiment, a number of input variables are provided for the set of constraint equations and a number of output variables are obtained from the constraint equations. The input variables include: a valid data period at the minimum frequency, a valid data period at the maximum frequency, a minimum gate delay, and a maximum gate delay. The output variables include: the total number of taps, the number of tap feeds to the correlator, and the guaranteed error performance. Desirably, the multi-phase signals in each tap set are used to determine the state of the input signal for that tap set via a simple majority rule voting algorithm.

In a preferred embodiment, the optimal circuit implementation is determined using five constraint equations. In alternate embodiments, a different number of constraint equations can be used.

First, the maximum tap set delay period is determined. In this case, $$D_{max}=INT(P_v(\text{maxf})/4), \text{ where:}$$

$D_{max}$=maximum desired tap set delay period;
$P_v$(maxf)=valid data period @ maximum frequency; and
dividing the valid data period by 4 guarantees that at least 3 tap sets fall within a valid data period.

Second, the number of taps in a tap set is determined. In this case, $$N=INT(D_{max}/G_{max}), \text{ where:}$$

N=number of taps in a tap set;
$G_{max}$=maximum single gate delay; and
INT( )=round down to the nearest integer function.

Desirably, N is the number of multi-phase signals sent to the multi-phase signal router from the multi-phase signal generator.

In a preferred embodiment, the number of taps in a tap set (N) is calculated using the maximum desired tap set delay period and the maximum gate delay. The gate delay within an ASIC varies over temperature, voltage, and manufacturing process. In alternate embodiments, the maximum desired tap set delay period and the maximum gate delay do not have to be used. For example, average values could be used.

In a preferred embodiment, the number of taps in a tap set is determined before the clockless synchronizer is fabricated. Desirably, this allows the clockless synchronizer to operate faster. In alternate embodiments, the number of taps in a tap set can be controlled by a combination of hardware and software means. For example, a set of switches could be used in the multi-phase signal generator or in the multi-phase signal router. In these embodiments, the software means allows the variables in the constraint equations to become variables that can be changed as conditions change.

Third, the minimum tap delay period is determined. In this case, $$D_{min}=N*G_{min}, \text{ where:}$$

$D_{min}$=minimum tap set delay period; and
$G_{min}$=minimum single gate delay.

Fourth, the minimum scan period required is determined. In this case, $$S=2(P_v(\text{minf}))+3(P_t(\text{minf})), \text{ where:}$$

S=minimum scan period required to detect two edges;
$P_v$(minf)=valid data period @ minimum frequency; and
$P_t$(minf)=transition period @ minimum frequency.

Fifth, the total number of taps is determined. In this case, $T=RND(S/D_{min})$, where:

T=the total number of tap sets; and

RND( )=round up to the nearest integer function.

Desirably, T is the number of multi-phase signals sent to the multi-phase signal sampler from the multi-phase signal router.

In a preferred embodiment, the number of tap sets is calculated using the minimum desired tap set delay period and the minimum gate delay. The gate delay within an ASIC varies over temperature, voltage, and manufacturing process. In alternate embodiments, the minimum desired tap set delay period and the minimum gate delay do not have to be used. For example, average minimum values could be used.

In a preferred embodiment, the number of tap sets (T) is determined before the clockless synchronizer is fabricated. Desirably, this allows the clockless synchronizer to operate faster. In alternate embodiments, the number of tap sets can be controlled by a combination of hardware and software means. For example, a set of switches could be used in the multi-phase signal router or in the multi-phase signal sampler. In these embodiments, the software means allows the variables, used to calculate T, to become variables that they can be changed as conditions change.

In a preferred embodiment, the maximum desired tap set delay value is calculated using: $F_{max}$, the maximum data input frequency, V, the variable delay value, and M, the metastability value. V is the variation in expected edge location due to skew, jitter, and other factors. M is the offset from the expected edge location due to rise and hold time of the D flip-flops.

The bit period at the maximum frequency is determined using the following:

$P(maxf)=1/F_{max}$, where

P(maxf)=>bit period (ns) @ max frequency; and $F_{max}$=>maximum data input frequency (Hz).

The transition period at the maximum frequency is determined using the following:

$P_t(maxf)=P(maxf)-V-M$, where $P_t(maxf)$=>transition period (ns) @ max frequency;

V=>variable delay (ns); and

M=>metastability (ns).

The valid data period at the maximum frequency is determined using the following:

$P_v(maxf)=P(maxf)-P_t(maxf)$ where $P_v(maxf)$=>valid data period (ns) @ max frequency.

In a preferred embodiment, the minimum desired tap set delay value is calculated using: $F_{min}$, the minimum data input frequency, $G_{min}$, the minimum gate delay, and N, the number of gates per tap.

The bit period at the minimum frequency is determined using the following:

$P(minf)=1/F_{min}$, where

P(minf)=>bit period (ns) @ min frequency; and $F_{min}$=>minimum data input frequency (Hz).

The transition period at the minimum frequency is determined using the following:

$P_t(minf)=P(minf)-V-M$, where $P_t(minf)$=>transition period (ns) @ min frequency.

The valid data period at the maximum frequency is determined using the following:

$P_v(minf)=P(minf)-P_t(minf)$, where $P_v(minf)$=>valid data period (ns) @ min frequency.

In a preferred embodiment, the timing periods are calculated using the maximum operating frequency and the minimum operating frequency. The operating frequencies associated with an ASIC vary over temperature, voltage, and manufacturing process. In alternate embodiments, the maximum operating frequency and the minimum operating frequency do not have to be used. For example, average values could be used, where the averages are determined during the manufacturing process.

In a preferred embodiment, the timing periods are determined before the clockless synchronizer is fabricated. Desirably, this allows the clockless synchronizer to operate faster. In alternate embodiments, the timing periods can be controlled by software means allowing the variables in the constraint equations to become variables that can be changed as conditions change. For example, variable could be changed due to changes in temperature, changes dues to degradation with time, and failures.

Figure 6:
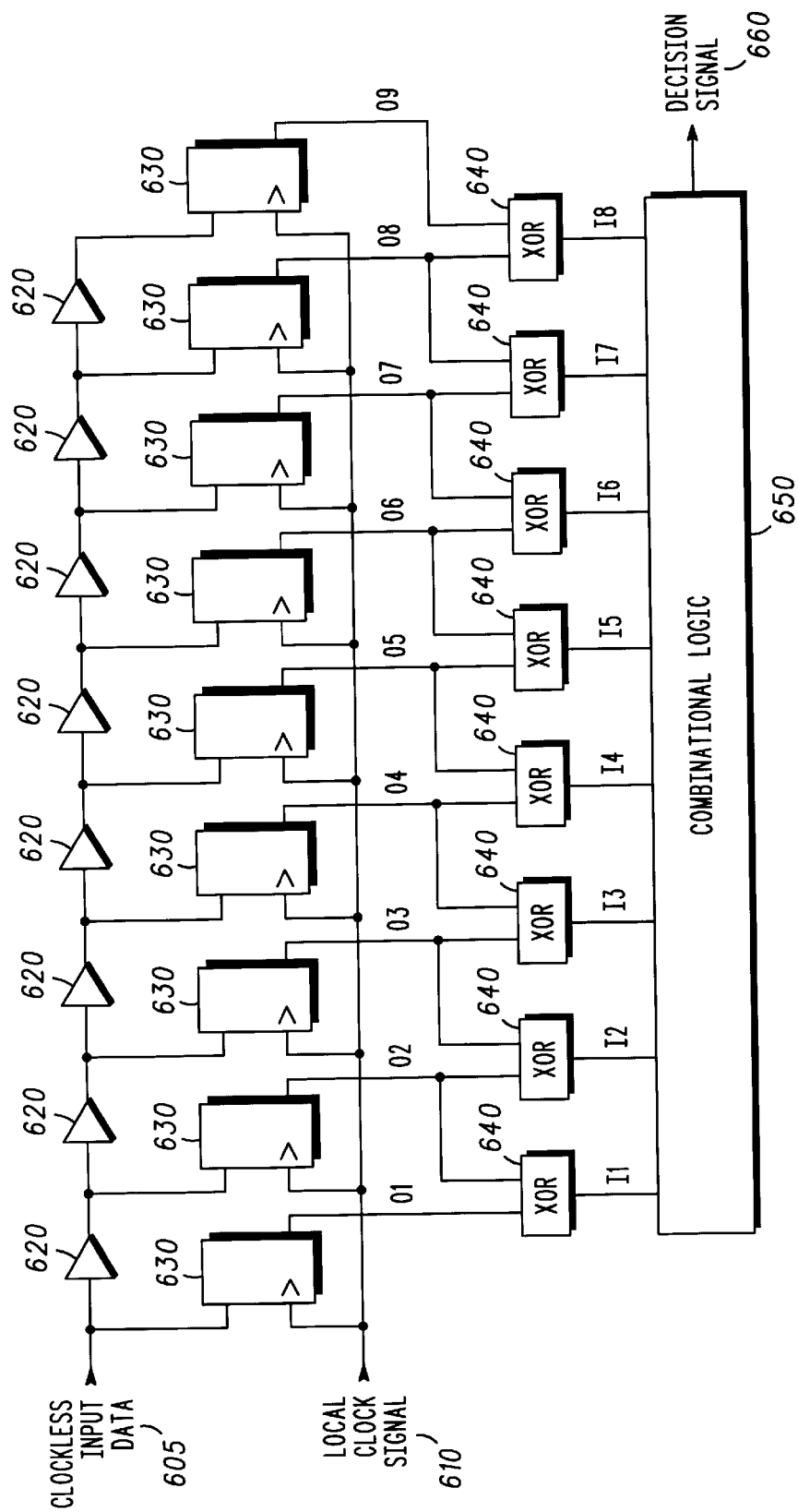
FIG. 6 illustrates a simplified block diagram of an exemplary decision circuit in accordance with a preferred embodiment of the invention.

FIG. 6 illustrates a simplified block diagram of an exemplary decision circuit in accordance with a preferred embodiment of the invention. Decision circuit 600 comprises clockless input data input 605, local clock signal input 610, and decision signal output 660. In addition, decision circuit 600 comprises a plurality of gates 620, a plurality of D-type flip-flops 630, a plurality of exclusive-or circuits 640, and combinational logic 650.

In FIG. 6, clockless input data input 605 is shown coupled to one gate and one flip-flop, although this is not required for the invention. For example, one or more gates could be included between the input and the flip-flop.

D-type flip-flops 630 are shown coupled to the outputs of a series of gates 620. In alternate embodiments, the gates could be replaced by other delay elements, and other types of flip-flops could be used.

Local clock signal input 610 is coupled to the clock inputs on D-type flip-flops 630. In a preferred embodiment, the local clock signal is provided to the flip-flop clock inputs at substantially the same time, so that the flip-flops sample their input signals synchronously.

In FIG. 6, the outputs from D-type flip-flops 630 are coupled to inputs of 2-input exclusive-or circuits 640. The flip-flop outputs are labeled O1, O2, O3, O4, O5, O6, O7, O8, and O9.

The outputs from exclusive-or circuits 640 are coupled to inputs of combinational logic circuit 650. The exclusive-or outputs are labeled I1, I2, I3, I4, I5, I6, I7, and I8.

Combinational logic circuit 650 uses input signals I1, I2, I3, I4, I5, I6, I7, and I8 along with a set of rules to make a best signal determination. The decision is provided at decision signal output 660.

FIG. 7 illustrates an exemplary decision table used in accordance with the decision circuit 600 shown in FIG. 6. Decision table 700 comprises output signals 710, input signals 720, edges 730, and decisions 740.

Outputs signals 710 comprise signals O1, O2, O3, O4, O5, O6, O7, O8, and O9. Input signals 720 comprise signals I1, I2, I3, I4, I5, I6, I7, and I8. Edges 730 comprise columns E1 and E2. In this example, the circuit is balanced when each bit period is four tap sets in length. The sampling period is for two valid data periods (3 tap sets *2) plus 3 invalid data periods (1 tap set *3) for a total of 9 tap sets. Those skilled in the art will recognize that different numbers of output signals and input signals could be used in alternate embodiments.

Decision signals 740 are determined by combinational logic circuit 650. In a preferred embodiment, edges and decision signals are determined using input signals 720. In alternate embodiments, output signals 710 can also be used to determine decision signals 740.

Decision signals 740 are used to establish when positive clock edges have been detected and when negative clock edges have been detected. Desirably, one input signal is high while the other input signals are low indicating a single transition has occurred. For example, this condition occurs for a clean transition.

FIG. 8 illustrates a second exemplary decision table used in accordance with the decision circuit shown in FIG. 6. Decision table 800 comprises clock number 810, output signals 820, input signals 830, and edges 840.

Outputs signals 820 comprise signals Oa, Ob, Oc, Od, Oe, Of, Og, Oh, and Oi. Input signals 830 comprise signals Ia, Ib, Ic, Id, Ie, If, Ig, and Ih. In this example, the circuit has unbalanced setup and hold times, and FIG. 8 shows the edges detected for multiple samples. For example, when a short tap delay is established, there are multiple transitions, such as illustrated by samples 1, 3, 5, 7, 9, and 11. Output signals 820 and input signals 830 are a subset of the total signals. In one embodiment, the selection of the output is determined by the input signal that has the most edges detected and then clocking the data on the opposite clock edge. When adjacent signals have the same edge count, either signal can be selected. Those skilled in the art will recognize that different numbers of output signals and input signals could be used in other embodiments.

In a system with high jitter due to different valid periods for high and low bits a greater number of tap sets is required. Having a greater number of tap sets allows the correlation circuit to determine the range of taps that occur during the valid periods and select the one closest to the middle of the period.

In one alternate embodiment, the apparatus is designed for short data bursts where reacquisition is performed often. Desirably, the length of the data burst is determined by the delta between the sender's clock and the receiver's clock. When the clocks are close in frequency, larger bursts are allowed because there is less drift.

In another embodiment, the apparatus can be designed to reacquire continuously, and the picked signal is shifted during long data bursts. This design uses a smaller sampling period that is equal to one and a half times the bit period. Desirably, this guarantees at least one edge during the sampling period. Once the edge is detected, the signal with the detected edge is used. Detection is determined on the one edge of the clock, and the opposite edge is used to clock out valid data.

The invention provides a method and apparatus for using clockless data transfers between devices, such as computers and peripheral resources. The invention has been described above with reference to a preferred embodiment. However, those skilled in the art will recognize that changes and modifications can be made in this preferred embodiment without departing from the scope of the invention. For example, the sampling devices identified herein can be changed while achieving substantially equivalent results.

What is claimed is:

1. A clockless synchronizer comprising:
a multi-phase signal generator for providing N multiphase signals, where N is a positive integer;
a multi-phase signal router coupled to said multi-phase signal generator for receiving said N multi-phase signals and sending M multi-phase signals, where M is a positive integer not equal to N;
a multi-phase signal sampler coupled to said multi-phase signal router for receiving said M multi-phase signals and for sending M sampled signals;
a correlation control circuit coupled to said multi-phase signal router and coupled to said multi-phase signal sampler for determining a best clock correlated multi-phase signal from said M sampled signals;
a timing generator coupled to said correlation control circuit, said timing generator providing timing pulses at a known rate;
an output data selector coupled to said correlation control circuit and coupled to said multi-phase signal sampler for selecting said best clock correlated multi-phase signal from said M sampled signals; and
said correlation control circuit further comprises means for inhibiting sampling circuits in said multi-phase signal sampler.

2. The clockless synchronizer as claimed in claim 1, wherein said multi-phase signal generator comprises means for providing said N multi-phase signals as signals that are phase-shifted relative to each other.

3. The clockless synchronizer as claimed in claim 2, wherein said multi-phase signal generator comprises a plurality of gates and uses gate delays for providing said N multi-phase signals.

4. The clockless synchronizer as claimed in claim 1, wherein said multi-phase signal router comprises means for routing signals at a first number of input ports to a second number of output ports.

5. The clockless synchronizer as claimed in claim 1, wherein said multi-phase signal sampler comprises at least three flip-flop circuits.

6. The clockless synchronizer as claimed in claim 1, wherein said multi-phase signal sampler comprises at least three latch circuits.

7. The clockless synchronizer as claimed in claim 1, wherein said correlation control circuit comprises means for performing binary comparisons between a number of multi-phase signals and a local clock signal from said timing generator.

8. The clockless synchronizer as claimed in claim 1, wherein said correlation control circuit comprises means for using a set of equations for performing correlations between a number of multi-phase signals and a local clock signal.

9. The clockless synchronizer as claimed in claim 1, wherein said correlation control circuit comprises a state machine for performing binary comparisons between a number of multi-phase signals and a local clock signal.

10. The clockless synchronizer as claimed in claim 1, wherein said correlation control circuit further comprises means for providing selection signals to said output data selector.

11. The clockless synchronizer as claimed in claim 1, wherein said correlation control circuit further comprises means for determining said best clock correlated multi-phase signal.

12. The clockless synchronizer as claimed in claim 11, wherein said correlation control circuit further comprises means for using a clock signal, a setup time, and a hold time for determining said best clock correlated multi-phase signal.

13. A circuit for synchronizing clockless signals, the circuit comprising:
- a multi-phase signal generator for providing N multiphase input signals, where N is a positive integer, and wherein the multi-phase signal generator comprises a series of gates, each gate having at least one semiconducting junction;
- a multi-phase signal router coupled to said multi-phase signal generator for receiving said N multi-phase input signals and for routing the N multi-phase input signals between a plurality of outputs to create M multi-phase output signals, where M is a positive integer not equal to N;
- a multi-phase signal sampler coupled to said multi-phase signal router and having a plurality of sampling circuits, wherein the multi-phase signal sampler is configured to receive said M output multi-phase signals and to produce M sampled signals from said plurality of sampling circuits;
- a correlation control circuit coupled to said multi-phase signal router and to said multi-phase signal sampler for determining a best clock correlated multi-phase signal from said M sampled signals;
- a timing generator coupled to said correlation control circuit, said timing generator providing timing pulses at a known rate;
- an output data selector coupled to said correlation control circuit and coupled to said multi-phase signal sampler for selecting said best clock correlated multi-phase signal from said M sampled signals; and
- an inhibiting circuit configured to inhibit selected ones of said plurality of sampling circuits in said multi-phase signal sampler as a function of the best clock correlated multi-phase signal.

* * * * *